United States Patent [19]

Okikawa et al.

[11] Patent Number: 4,791,472
[45] Date of Patent: Dec. 13, 1988

[54] LEAD FRAME AND SEMICONDUCTOR DEVICE USING THE SAME

[75] Inventors: Susumu Okikawa, Ohme; Akira Miyairi, Musashino, both of Japan

[73] Assignee: Hitachi, Ltd., Tokyo, Japan

[21] Appl. No.: 153,942

[22] Filed: Feb. 9, 1988

Related U.S. Application Data

[63] Continuation of Ser. No. 898,534, Aug. 21, 1986, abandoned.

[30] Foreign Application Priority Data

Sep. 23, 1985 [JP] Japan .................................. 60-209951

[51] Int. Cl.[4] ........................................... H01L 23/48
[52] U.S. Cl. ........................................ 357/70; 357/72
[58] Field of Search ..................................... 357/70, 72

[56] References Cited

U.S. PATENT DOCUMENTS 4,234,666 11/1980 Gursky ................................ 357/70

FOREIGN PATENT DOCUMENTS

| 54-136179 | 10/1979 | Japan | 357/70 |
| 55-162251 | 12/1980 | Japan | 357/70 |
| 57-66656 | 4/1982 | Japan | 357/70 |
| 59-88857 | 5/1984 | Japan | 357/70 |
| 60-123046 | 7/1985 | Japan | 357/72 |

OTHER PUBLICATIONS

Integrated Mounting Techniques, Microelectronics Association 1/15/80.

Primary Examiner—Andrew J. James
Assistant Examiner—Mark Prenty
Attorney, Agent, or Firm—Antonelli, Terry & Wands

[57] ABSTRACT

A resin encapsulated type semiconductor device is manufactured by using a lead frame in which a stress relaxation portion is formed near the connection portion between the tab suspending the lead and the tab according to this invention, whereby stress concentration to the tab at the connection portion of the tab suspending lead can be prevented even when the tab as the pellet mounting portion is thermally expanded thereby preventing crackings from resulting in the semiconductor pellets.

2 Claims, 3 Drawing Sheets

LEAD FRAME AND SEMICONDUCTOR DEVICE USING THE SAME

This is a continuation of Ser. No. 898,534, filed 8/21/86, now abandoned.

BACKGROUND OF THE INVENTION

This invention concerns a lead frame and a semiconductor device using the same and, more particularly, it relates to a technic useful for applying to a resin encapsulation lead frame and a resin encapsulated type semiconductor device.

Generally, a resin encapsulated type semiconductor device is manufactured by the process of bonding a semiconductor pellet on the tab portion of a lead frame, making an electrical connection between the electrodes of the semiconductor pellet and the inner leads of the lead frame, then forming a package made of a resin such as an epoxy resin by means of molding and then applying the cutting of the frame portion and the forming of the leads to the lead frame.

By the way, as the size for the semiconductor pellet has been increased in recent years, that for the tabs as the mounting portion therefor has also been increased correspondingly. While on the other hand, the size for the package for encapsulating the semiconductor pellet for the like is standarized. Accordingly, the length of a tab suspending lead embedded in the resin of the package is shortened and corrosive substances such as water are more liable to intrude along the interface between the tab suspending lead and the packing resin. Particularly, since moisture content or the like is more liable to intrude of defoliation occurs at the interface, it is desirable to provide a structure not causing the defoliation at the interface.

In view of the above, the present invention have made a study on forming a lock portion such as through holes at a portion of the tab suspending lead in order to enhance the bonding between the tab suspending lead and the encapsulating resin. In this way, defoliation at the interface between the lead frame and the packaging resin can effectively be prevented irrespective of the stresses formed upon cutting the tab suspending lead after the completion of the resin mold, or of the shear stresses resulting between them by the difference in the heat expansion coefficients between the lead and the packaging resin.

SUMMARY OF THE INVENTION

However, the present inventors have found that although the above-mentioned structure can desirably prevent the defoliation between the tab suspending lead and the encapsulating resin, cracks are liable to be caused at the periphery of the semiconductor pellet in the portion nearer to the tab suspending lead.

Specifically, the tab portion is thermally expanded by the temperature rise due to the heat generation of the semiconductor pellet during operation of the semiconductor device. In this case, the temperature near the tab suspending lead is relatively low depending on the heat flow. Further, the tab suspending lead is firmly bonded by the lock portion to the encapsulating resin as described above. Accordingly, the tab portion is thermally expanded in a state being substantially held by the tab suspending lead. As a result, thermal stresses are given to the tab portion. In this case, the stresses are concentrated in the structurally discrete portion, that is, the connection portion between the tab portion and the tab suspending lead to result in the stress deformation at that portion. As a consequence, a large stress is applied to the bonding face with the semiconductor pellet around the connection portion. As a result, chips or cracks are caused in the semiconductor pellet.

In the case where the working temperature is high, the hardness of the resin near the tab portion is greatly reduced by the temperature rise due to the heat generation of the semiconductor pellet, thereby making the resin of the packaging material softened at the periphery of the pellet and the tab. As a result, when the tab tends to thermally expand in the direction of the tab suspending lead (horizontal direction) corresponding to the thermal deformation of the tab, since the encapsulation resin intrudes in the through holes of the lock portion formed to the tab suspending lead to inhibit the horizontal deformation of the tab suspending lead, thermal deformation of the tab due to the heat expansion causes thermal deformation and stress not only in the horizontal direction but also in the vertical direction, in which the synergistic effect between such stresses and the heat deformation of the pellet are applied to the pellet resulting in damages such as chips or cracks of the pellet.

Accordingly, the undesirable phenomenon described above causes a serious problem, particularly, in the high temperature operation, for example, in a so-called aging test in which the operation test is carried out while heating the entire device to a high temperature.

FIG. 6 shows the state of the temperature distribution in an aging test of a resin encapsulated semiconductor device in which a through hole as the lock portion is formed in a tab suspending lead. The aging test condition in this case comprises an atmospheric temperature (temperature at high temperature operation) of 125° C. and a working electrical power Pc applied of 240 mV.

FIG. 6 shows a portion of a package 19 comprising a pellet 15, a tab 16, a tab suspending lead 17, a through hole 18 for the lock portion formed in the tab suspending lead 17 and a resin encapsulation material at the periphery thereof of the semiconductor device.

As apparent from FIG. 6, in the aging test or the like in which the operation test is carried out at high temperature, the temperature near the pellet 15 is as high as 150° C., while the temperature in the resin within the through hole 18 of the lock portion is 128° C. and the temperature difference therebetween is 23° C. There is a large temperature difference between the outer periphery of the package and the pellet as: 150° C.−125° C.=25° C. The temperature difference brings about internal stresses in the pellet 15, tab 16 and between the pellet 15 and the tab 16.

It has been found that since the tab suspending lead 17 is secured fixedly by the resin in the through hole 18 as the lock portion of the tab suspending lead 17, there is no room for the internal stresses or the thermal deformation strains generated due to the temperature difference inside the package in the longitudinal direction (horizontal direction) of the tab suspending lead and, therefore, the leads internal stresses or strains are concentrated near the connection portion between the tab 16 and the suspending lead 17. It has also been found that the concentrated stresses are exerted as a vertical force between the tab and pellet and are applied to the pellet, by which damages such as chips or cracks in the pellet are caused.

The resin encapsulated type semiconductor device has been described in "Integrated Mounting Technics" p 149-150, edited by Japan Microelectronics Association, published from KOGYO CHOSAKAI CO. Ltd. on Jan. 15, 1980.

The object of this invention is to provide a technic capable of preventing the crackings in the pellet of the semiconductor device.

These and other objects, as well as novel features of this invention will become apparent by reading the following description of the specification while referring to the accompanying drawings.

Representatives of the invention disclosed in the present application are briefly described as below.

In the case of manufacturing a resin encapsulated type semiconductor device by using a lead frame, in which a stress relaxation portion is formed near the connection portion between the tab suspending lead and the tab, stress concentration to the tab of the connection portion of the tab suspending lead can be prevented even if the tab as the pellet mounting portion is thermally expanded, by which the occurrence of crackings in the semiconductor pellet can be prevented.

DESCRIPTION OF THE PREFERRED EMBODIMENTS

Example 1

Figure 1:
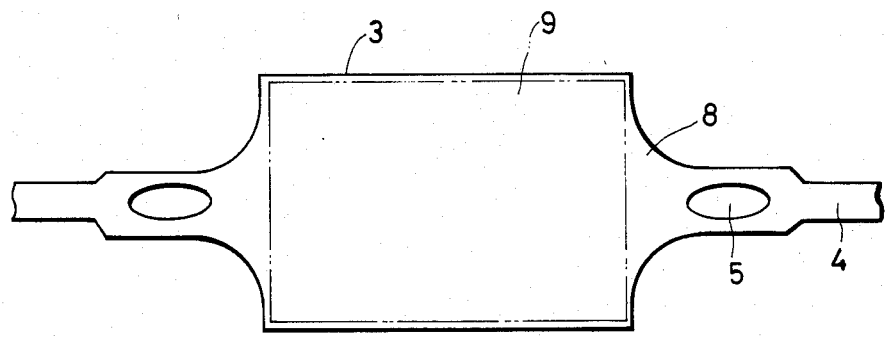
FIG. 1 is an enlarged plan view for a portion of the lead frame applied to the semiconductor device as the first embodiment of this invention.
Figure 2:
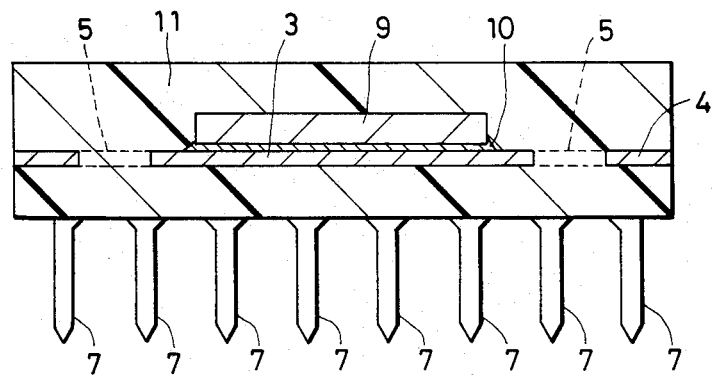
FIG. 2 is a schematic cross sectional view showing the semiconductor device of the first embodiment.
Figure 3:
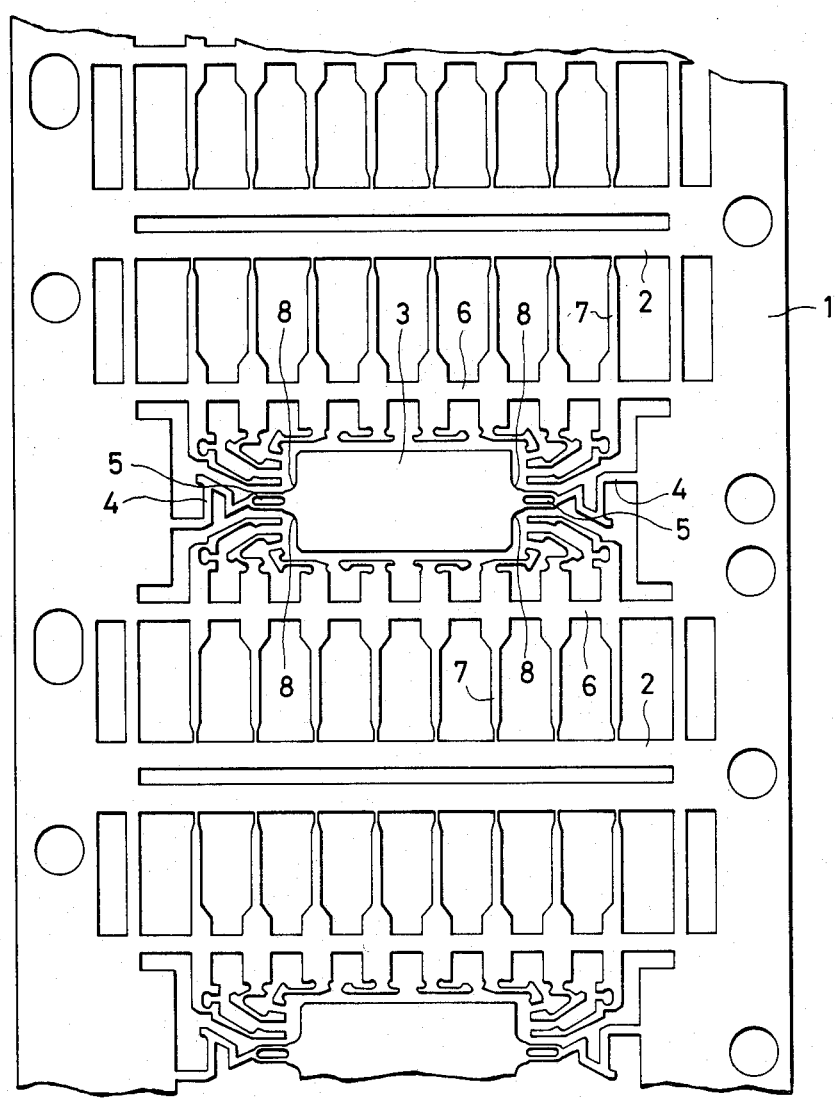
FIG. 3 is a schematic plan view for a portion showing one unit of the lead frame and the vicinity thereof applied to the semiconductor device.

FIG. 1 is an enlarged plan view for a portion of a lead frame applied to the semiconductor device as a first embodiment according to this invention, FIG. 2 is a schematic cross sectional view showing the semiconductor device of the first embodiment and FIG. 3 is a schematic plan view showing one unit of the lead frame applied to the semiconductor device described above.

The lead frame has a unit frame of a square shape surrounded with a frame member 1 and a partition frame 2 although not restricted thereto. A plurality of such unit frames are connected in the vertical direction shown in the figure. A tab 3 as a pellet mounting portion is disposed about at the central portion of the unit frame and the tab 3 is supported by way of tab suspending leads 4 to the outer frame 1. Further, leads 7 are extended from the partition frames 2 and supported at the midway thereof with tie bars 6. Then, a through hole 5 constituting the lock portion is formed in the tab suspending lead 4. Arcuate portions 8 that function as the stress relaxation portion are disposed at the connection portion between the tab 3 inside the through hole 5 and the tab suspending lead 4.

The semiconductor device of the first embodiment is manufactured as described below. At first, a semiconductor pellet 9 is attached by way of a bonding member 10 made of gold-silicon eutectic material to the tab 3 of the lead frame and then bonding pads of the semiconductor pellet 9 not illustrated and the leads are electrically bonded to each other by means of wire bonding technic. Then, a package is formed by means of molding using an epoxy resin 11. The size of the package is defined, for example, as shown by the dotted chain 20 in FIG. 3. Then, the semiconductor device is completed by cutting and forming the frame member 1, the partition frame 2 and the tie bar 6 of the lead frame by means of a pressing machine or the like.

FIG. 2 shows the semiconductor device as described above in the cross sectional view taken along the plane passing substantially the center of the tab suspending lead 4, which is a so-called dual in line package type semiconductor device. In the semiconductor of the first embodiment, a through hole 5 is formed in the tab 3 and the tab suspending lead 4 as described above. Accordingly, upon mold-forming the package, the resin 11 intrudes also in the through hole 5, by which the movement of the tab suspending lead 4 is completely inhibited. Accordingly, an extremely firm bonding can be attained between the tab suspending lead 4 and the packaging resin 11.

By the way, when the tab is thermally expanded due to the temperature rise accompanying the heat generation of the semiconductor pellet during operation of the semiconductor device, the stresses are concentrated at the connection portion at which the tab suspending lead 4 is connected to the tab 3 since the tab is firmly secured to the tab suspending lead 4.

Accordingly, in the case where the width of the connection portion between the tab 3 and the tab suspending lead 4 is narrow, a stress increased by so much is concentrated at the connection portion. As a result, the tab 3 undergoes a strong stress in the direction perpendicular to the surface of the tab to result in cracks in the semiconductor pellet firmly bonded to the tab surface.

However, in the semiconductor device of the first embodiment as described above, arcuate portions are formed on the connection portion between the tab 3 and the tab suspending lead 4 thereby greatly enlarging the width of the connection portion. In the case where the width of the tab 3 is about 4 mm and that of the tab suspending lead 4 is about 1.5 mm, the arcuate portion has an effect as the stress relaxation portion by setting its radius of curvature to about greater than 1 mm.

As has been described, since the width of the connection portion is large, the stresses can be dispersed correspondingly and, as a result, cracks in the pellet due to the concentrated stresses can effectively be prevented.

In the lead frame applied to the semiconductor device of the first embodiment, the connection portion between the tab 3 and the tab suspending lead 4 has a arcuate shape. Accordingly, abrasion to the press mold used for manufacturing the device is reduced and the cost of the lead frame can be reduced by so much.

Example 2

Figure 4:
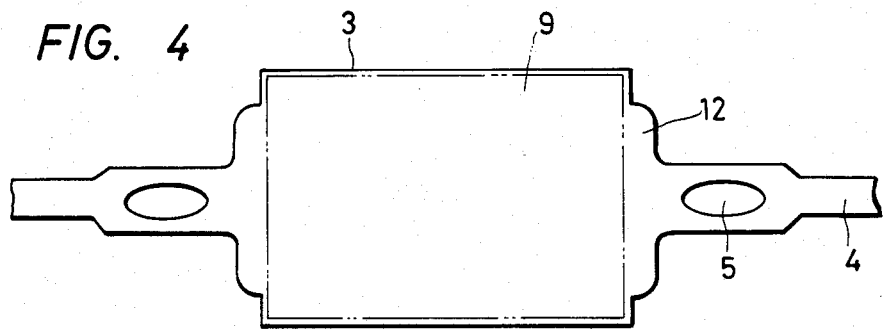
FIG. 4 is an enlarged plan view for a portion of a lead frame as the second embodiment of this invention applied to the semiconductor device.

FIG. 4 is an enlarged plan view of a portion of a lead frame as a second embodiment according to this invention applied to the semiconductor device.

In the semiconductor device of the second embodiment, a broad width portion 12 functioning as the stress relaxation portion is disposed at the connection portion between the tab 3 and the tab suspending lead 4. Other constitutions are substantially the same as those in the semiconductor device of the first embodiment.

Since the stresses caused in the connection portion can be dispersed by disposing the broad width portion 12 as described above, cracks in the pellet can effectively be prevented in the same manner as in the first embodiment.

Example 3

Figure 5:
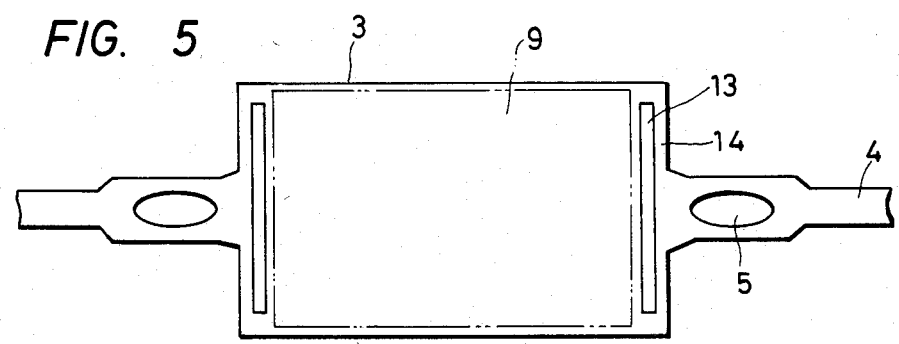
FIG. 5 is an enlarged plan view for a portion of a lead frame as the third embodiment of this invention applied to the semiconductor device.
Figure 6:
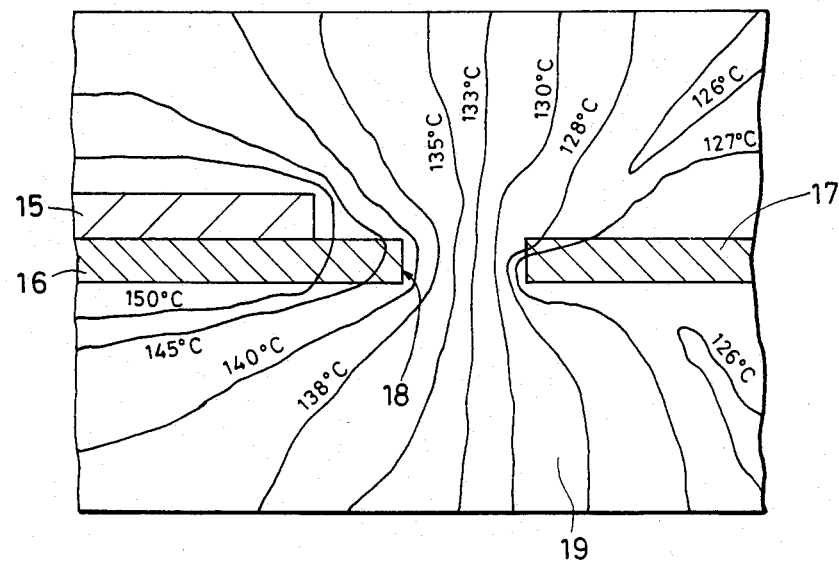
FIG. 6 is a schematic cross sectional view showing the temperature distribution in the aging state of a conventional resin encapsulated type semiconductor device in which a through hole for the lock portion is formed in the tab suspending lead.

FIG. 5 is an enlarged plan view of a portion of a lead frame as the third embodiment according to this invention applied to the semiconductor device.

In the semiconductor device of the third embodiment, a through hole 13 in the form of a slit that functions as the stress relaxation portion is disposed to the inside of the connection portion with the tab suspending lead 4. The size of the through hole 13 is such that the length thereof is at least larger than the width of the tab suspending lead 4. Other constitutions are the same as those in the previous first embodiment.

As described above, the stresses can be absorbed by the distortion of the beam portion 4 connected with the tab suspending lead 4 by disposing the through hole 13 to the tab 3. Accordingly, cracks in the semiconductor pellet caused by the stress concentration on one point of the tab 3 can effectively be prevented.

Various advantageous effects of this invention are set forth below.

By manufacturing a resin encapsulated type semiconductor device using a lead frame, in which a lock portion is formed in the tab suspending lead and a stress relaxation portion is formed to the inner side of the lock portion, since the stress concentration to the tab at the connection portion with the tab suspending lead due to the thermal expansion of the tab can be prevented, cracks in the semiconductor pellet can be prevented.

By adapting the stress relaxation portion to have an arcuate shape formed on the connection portion between the tab and the tab suspending lead, since the width of the connection portion can be enlarged, the stresses caused by the thermal expansion of the tab can be dispersed.

By enlarging the width of the stress relaxation portion formed at the connection portion between the tab and the tab suspending lead, stresses can be dispersed due to the reason described above.

By making the stress relaxation portion in the form of a through hole formed to the tab near the connection portion with the tab suspending lead, stresses caused by the thermal expansion of the tab can be absorbed owing to the distortion of the tab connected with the tab suspending lead.

By shaping the connection portion between the tab and the tab suspending lead arcuate, since the abrasion in the press mold for use in the manufacture of the lead frame can be reduced, the cost of the lead frame can consequently be reduced.

Although this invention made by the present inventors has been described specifically referring to examples, this invention is in no way limited to the foregoing embodiments but it is of course possible to make various modifications so long as they do not depart from the gist of the invention.

For example, the stress relaxation portion is not restricted only to those shown in the examples, but any of structures disposed to the inside of the lock portion for the identical purpose may be used.

Further, although the lock portion for the tab suspending lead has been explained referring to the through hole, it is not restricted thereto but any of structures having a recess, protrusion or evenness formed so as to prevent the deviation of the tab suspending lead in relation with the packaging resin may be used. Furthermore, according to this invention, those structures providing the stress relaxation portion on the tab and the tab suspending lead portion but not forming the lock portion comprising the through hole, recess and/or protrusion in the tab suspending lead can also provide the effect capable of preventing damages to the pellet such as cracks or chips due to the stress relaxation effect.

In the foregoing descriptions, although the invention made by the present inventors has been described in the case of applying the invention to a so-called dual in line package resin encapsulated type semiconductor device in the application field as the background therefor, this invention is not restricted thereto but it is an effective technic that can be applied, for example, to those semiconductor devices in which the package such as a flat package is formed with a resin mold.

What is claimed is:

1. A semiconductor device comprising a tab, tab suspending leads extended from the side of said tab by way of connection portions located between said tab and tab suspending leads, a pellet bonded to said tab, a plurality of leads disposed at the periphery of said tab, bonding wires in which a plurality of bonding electrodes in the pellet and corresponding leads are wirebonded to establish electric conduction, and a package in which at least said pellet, bonding wires and leads near the region connection with said bonding wires are resin-encapsulated, and wherein means are provided in said connection portions for stress relaxation, said means for stress relaxation comprising said connection portions between said tab and suspending leads being progressively widened by way of arcuate portions in a direction toward said tab and wherein the tab suspending leads each comprise a through hole therein located near the connection portions.

2. A semiconductor device as defined in claim 1, wherein the connection portions are progressively widened by way of arcuate portions with a radius of curvature greater than 1 mm formed near the tab.

* * * * *